United States Patent [19]

Ishii et al.

[11] 4,381,793
[45] May 3, 1983

[54] PRINTED CIRCUIT PLATE WASHING APPARATUS

[75] Inventors: Mineo Ishii, Fukuyama; Kosei Arimoto, Kasaoka, both of Japan

[73] Assignee: Ishii Hyoki Co., Ltd., Japan

[21] Appl. No.: 248,119

[22] Filed: Mar. 27, 1981

[30] Foreign Application Priority Data

Mar. 28, 1980 [JP] Japan .................................. 55-41107

[51] Int. Cl.³ .............................................. B08B 3/02
[52] U.S. Cl. ...................................... 134/60; 134/67; 134/184
[58] Field of Search ...................... 134/60, 64 R, 64 P, 134/67, 75, 122 R, 122 P, 184, 1

[56] References Cited

U.S. PATENT DOCUMENTS

| | | | |
|---|---|---|---|
| 3,123,083 | 3/1964 | Kearney et al. | 134/60 |
| 3,871,982 | 3/1975 | Idstein | 134/64 R X |
| 4,083,206 | 4/1978 | Lemon et al. | 134/60 X |
| 4,280,520 | 7/1981 | Fraula et al. | 134/60 |
| 4,311,157 | 1/1982 | Jubenville et al. | 134/184 X |

FOREIGN PATENT DOCUMENTS 1204815  9/1970  United Kingdom .................. 134/60

*Primary Examiner*—Robert L. Bleutge
*Attorney, Agent, or Firm*—William A. Drucker

[57] ABSTRACT

This printed circuit plate washing apparatus is used for effectively washing the openings of printed circuit plates, eliminating a cleaning water after etching printed circuit plates or nameplates, degreasing aluminum plates before printing and number plates before painting and washing iron, plastic or glass plates. For these purposes, said apparatus is divided into three sections (or chambers) such as a bring-in chamber, a washing chamber, and a wash-out/finishing chamber. Further, this washing line of said apparatus is so composed that a plate to be washed may be elevated in slope with a certain fixed angle for the level line from said bring-in chamber toward said wash-out/finishing chamber, thereby a washing water being overflown to said washing chamber and to said bring-in chamber in this order through respective partition plate. And a carrying means is provided in every chamber by means of belt, chain or wire net. Said partition plate located between said bring-in chamber and said washing chamber is provided with an insertion port which is sealed by rubber-oriented elastic means. Therefore, said plate to be washed can be directly brought into a washing solution in said washing solution in said washing chamber. Besides, said washing chamber is provided with an ultrasonic wave transmitter.

3 Claims, 4 Drawing Figures

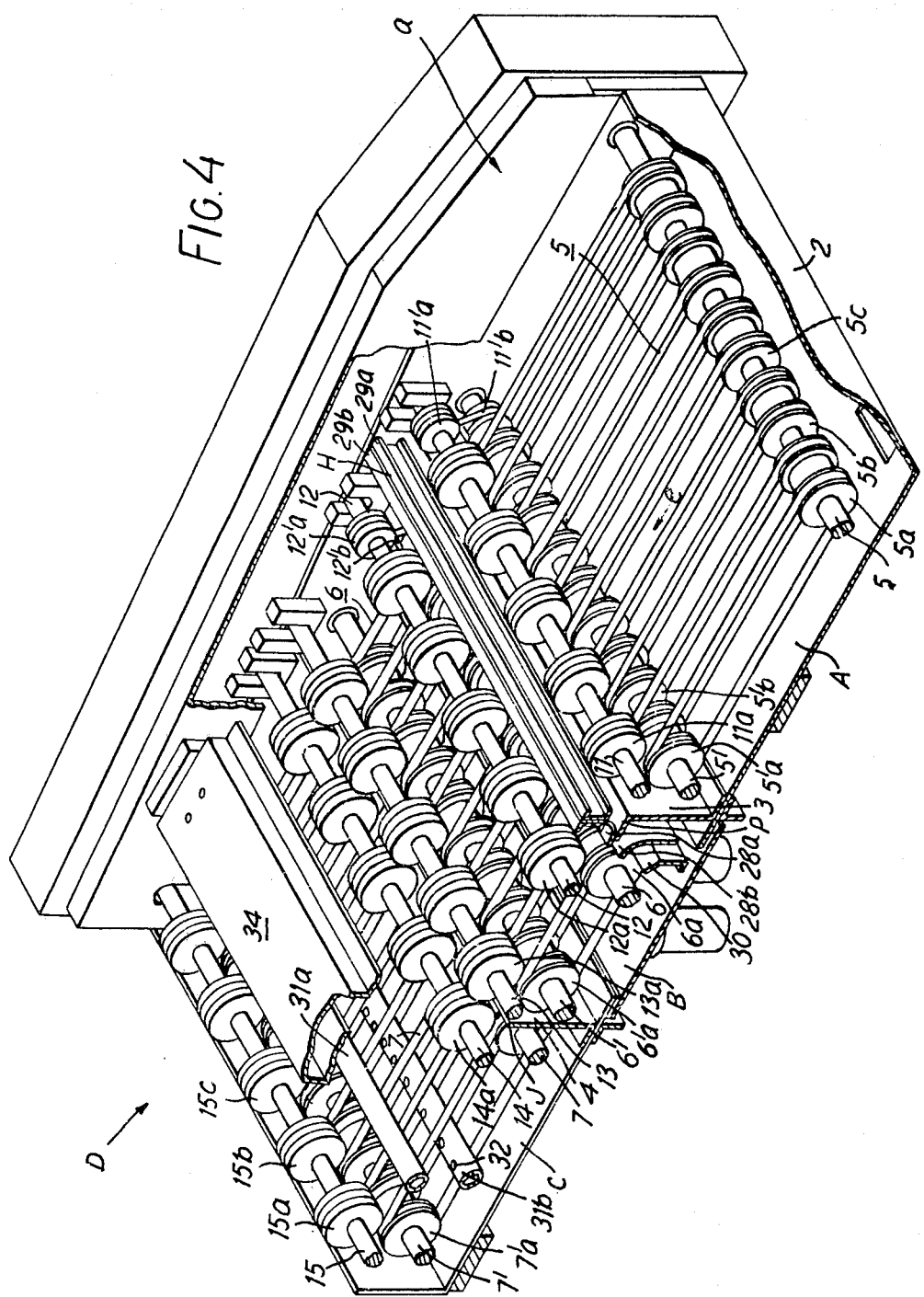

4,381,793

PRINTED CIRCUIT PLATE WASHING APPARATUS

BACKGROUND OF THE INVENTION

Washing equipments in which ultrasonic wave transmitter is utilized belong to prior art. In case of these washing equipments, matters to be washed are placed in a treatment tank and are irradiated by ultrasonic waves from an oscillator mounted on a wall or at the bottom of said tank for a certain predetermined interval. Namely, the washing method is limited only to batch treatment. Therefore, it requires much time and many troubles that matters to be washed are brought in or taken out of said tank. This kind of conventional washing equipments requires further wash-out treatment for which another separate device or manned work is indispensable. So, it is complicated or troublesome to wash and treat such plates or matters.

OBJECTS OF THE INVENTION

However, the present invention has disclosed a conveyor type washing system in order completely to solve the defaults of the conventional equipments.

One of the principal objects of the present invention is to propose a new and novel apparatus by which continuous washing and treatment work including a wash-out process can be effectively performed.

Another object of the present invention is to propose a compact and cheap apparatus, in which ultrasonic waves are utilized to effect heavy-duty washing work, in order to save manpower in assemblers' shops and to promote the productivity.

These and many other objects and features of the present invention will be made clear in the following descriptions in reference with the drawings attached herewith.

BRIEF DESCRIPTION OF THE DRAWINGS

FIG. 4 is a fragmentary perspective view of said washing/treatment tank.

DESCRIPTION OF THE PREFERRED EMBODIMENT

Figure 1:
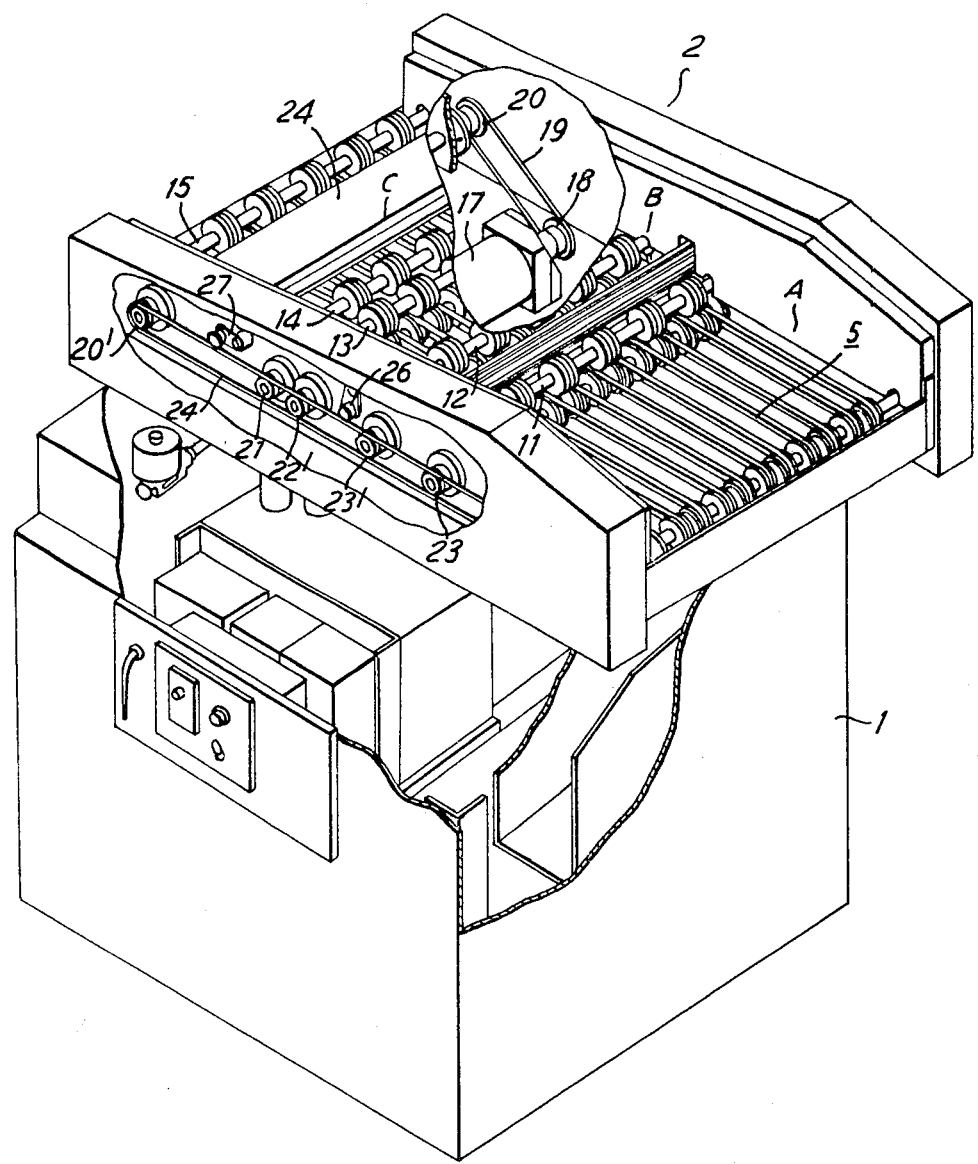
FIG. 1 is a partially fragmentary perspective view of the whole apparatus embodying the present invention.
Figure 2:
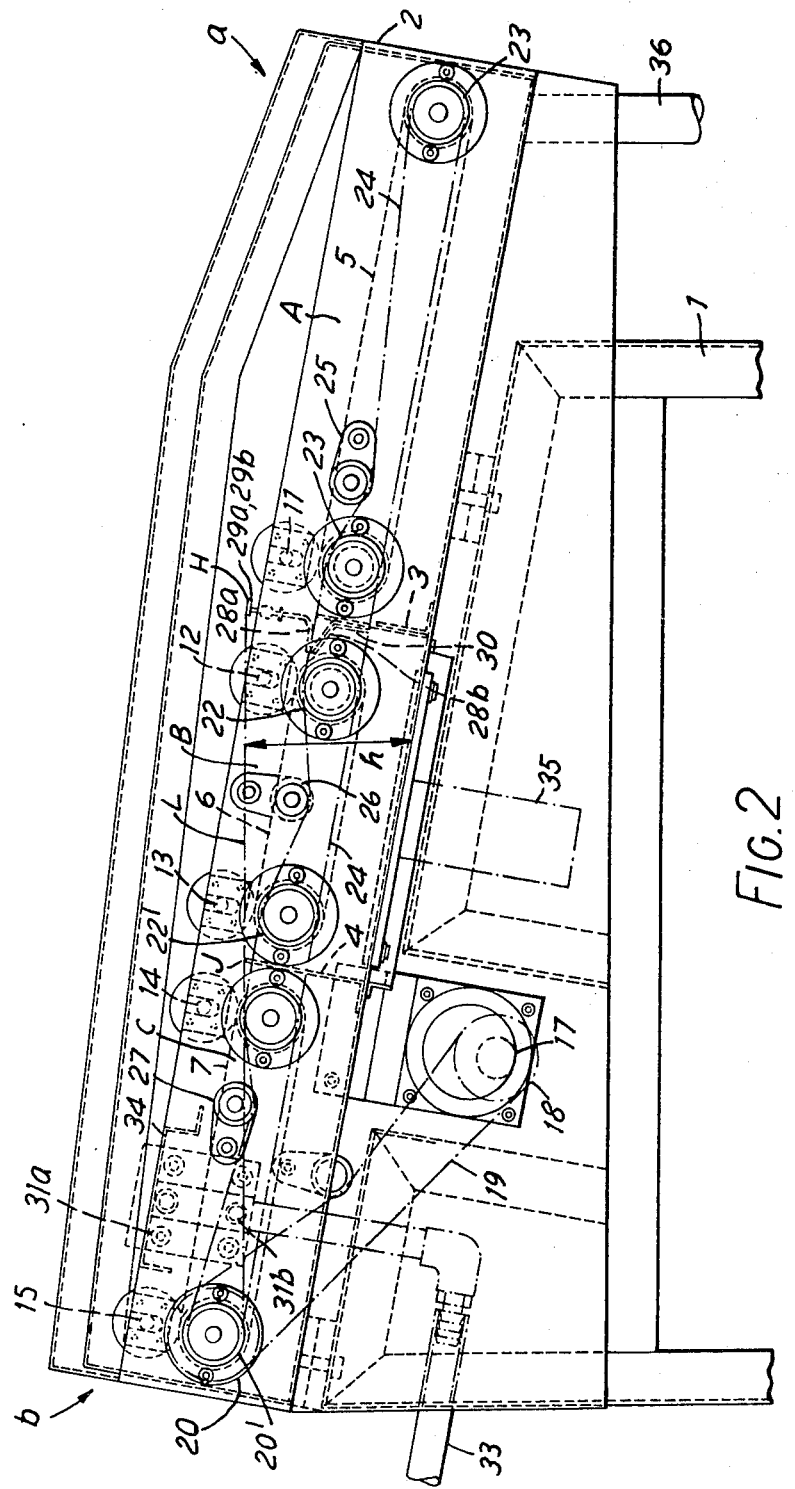
FIG. 2 is a front elevational view of a washing/treatment tank disclosed by the present invention.
Figure 3:
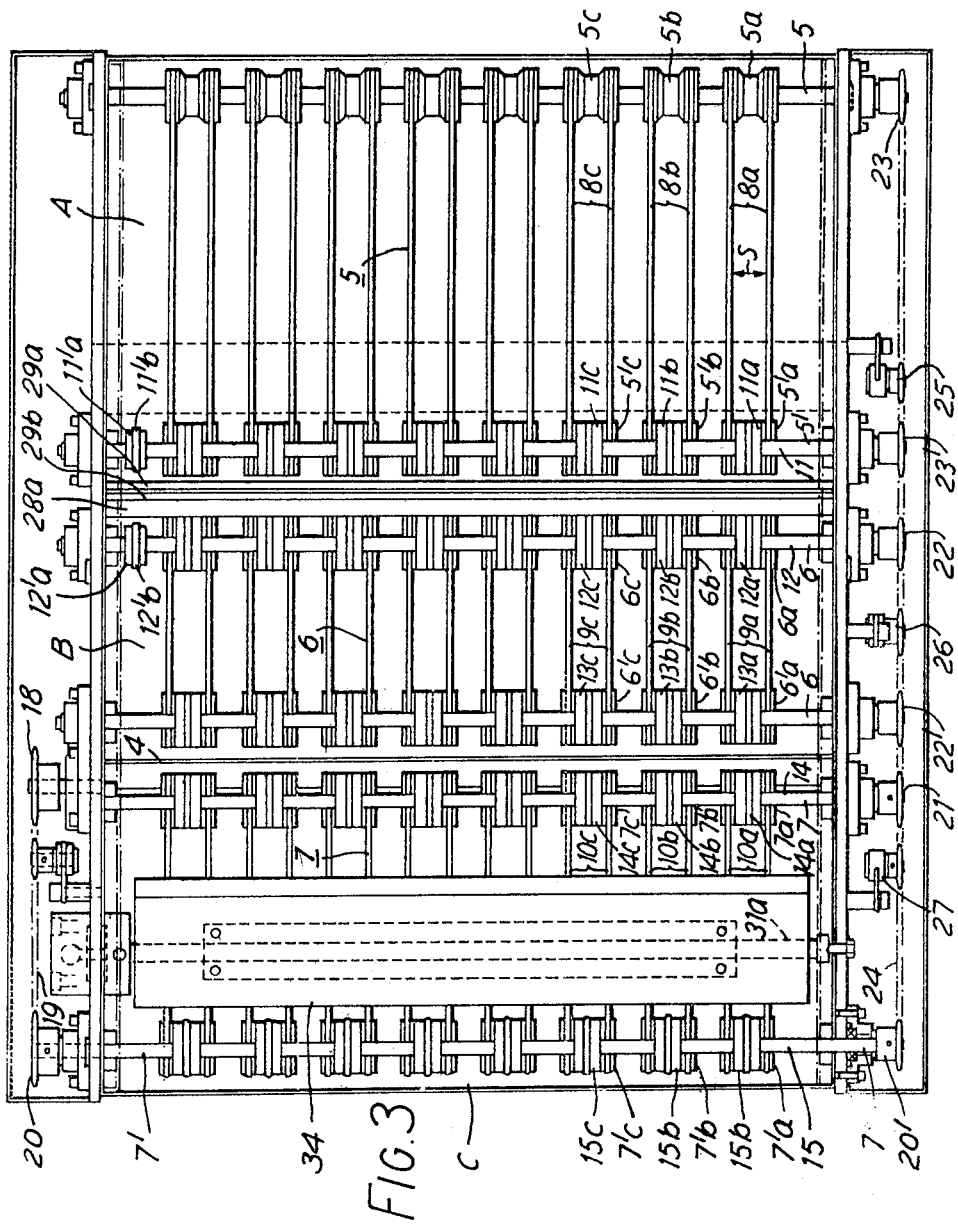
FIG. 3 is a plan view of said tank.

A box frame (1) of an apparatus embodying the present invention is provided with an amplifier and a control panel for ultrasonic wave transmitter hereinafter described in details. A washing/treatment tank (2) is placed on said box frame (1) and is so constructed as shown below.

Namely, said washing/treatment tank (2) is placed on said box frame (1) so that it may be placed in elevating slope with a certain predetermined angle for the level line toward the advancement direction of plates to be washed. Said washing/treatment tank (2) is divided into three chambers such as a bring-in chamber (A), a washing chamber (B) and a wash-out/finishing chamber (C). Partition plates (3) and (4) are provided between said bring-in chamber and said washing chamber, and between said washing chamber and said wash-out/finishing chamber.

Each of the three chambers (A), (B) and (C) is provided with a carrying roller means (5), (6), and (7), respectively, in order to carry the plates to be washed from one end to the other end of each chamber in turns. Said carry roller means is provided with a pair of rotary shafts 5 and 5', 6 and 6', and 7 and 7', respectively, at the width direction of each chamber. There are provided a plurality of grooved rollers 5a, 5b, 5c, . . . , 5'a, 5'b, 5'c, . . . , 6a, 6b, 6a, . . . , 6'a, 6'b, 6'c, . . . , and 7a, 7b, 7c, . . . , 7'a, 7'b, 7'c, . . . , at the corresponding positions of each rotary shaft. And carry belts 8a, 8b, 8c, . . . 9a, 9b, 9c, . . . and 10a, 10b, 10c, . . . are mounted between the corresponding grooved rollers and said carry belts are rotated all together in the same direction by a drive means hereinafter described in details. The rotation of said carry belts in the same direction ensures continuous washing treatment of articles to be washed, which are placed on said carry belts, from said bring-in chamber (A) to said wash-out/finishing chamber (C) through said washing chamber (B). The interval "S" between said carry belts is adjusted and determined by changing the number of said grooved rollers, the width thereof, and the width of said carry belts according to the size of an article to be washed. Presser roller shafts (11), (12), (13), (14) and (15) are provided with a plurality of grooved rollers (11a), (11b), (11c) . . . , (12a), (12b), (12c) . . . , (13a), (13b), (13c), . . . , (14a), (14b), (14c) . . . and (15a), (15b), (15c), . . . in their axial direction as well as each of said grooved rollers of said rotary shafts (5'), (6), (6'), (7) and (7'). Namely, said grooved rollers are rotated together with their respective lower side grooved roller. Said presser rollers are not necessarily indispensable to an apparatus disclosed by the present invention but they are effective to carry articles to be washed without any slip on said carry belts by pressing said articles against said lowerside grooved rollers. These presser rollers can rotate together with the lowerside rollers with self-weight of said presser rollers only by placing them on said lowerside rollers. However, these presser roller shafts may be positively rotated by transmitting the rotation of said lowerside roller shafts to said presser roller shafts. In the embodiment illustrated in the attached drawings, the presser roller shafts (11) and (12) are so constructed that they may be positively rotated by transmitting the rotation of the lowerside roller shafts to said presser roller shafts. Pulleys (11'a) and (12'a) and belts (11'b) and (12'b) are provided for the above purpose.

A drive motor (17) with a reduction gear is mounted at a side wall of the bottom section of said washing/treatment tank (2). Drive force of said motor is transmitted to sprocket (20), which is mounted at the same side of a rotation shaft (7') as a sprocket (18) and a chain (19). Another sprocket (20') is mounted at the opposite side of said rotation shaft (7') and is linked with still other sprockets (21), (22'), (22), (23') and (23), which are mounted at the same side of each of rotary shafts, by means of chain (24), thereby each of said roller shafts being rotated in the same direction. Chain-tensioning means (25) and (26) and (27) are provided to prevent said chain from beng slackened.

In the washing apparatus disclosed by this present invention, the upper edge of said partition plate (3) is so formed as to be of key-shaped tongue (P) projecting toward said washing chamber (B). The height up to said upper edge of said partition plate (3) is designed to be of a certain fixed height in such a manner that it may easily become possible for said articles to be washed, which are carried from bring-in chamber (A) with said articles placed on said belts (8a), (8b), (8c), ..., to enter said washing chamber (B), as sliding on said tongue (P), without any difficulty or hooking. And rubber-oriented elastic means (28a) and (28b) are mounted on and below said tongue (P) and the top edges thereof are folded or bent along the advancement direction of said articles so that they may not interrupt the advancing movements of said articles for washing treatment. At this time, it is much recommended that the top edges (28a) and (28b) folded as shown in the above are so composed that they may come in touch with each other at their extreme tops at the forward end of said tongue (P). This is because the sealing effect is much promoted if they are in touch with each other.

Said rubber-oriented elastic means (28a) is held between a pair of shaped steel members (29a) and (29b) whose ends are mounted at both side walls in said washing/treatment tank. The other rubber-oriented elastic means (28b) rests at said partition wall (3) by means of set metal fittings (30). Here, the upper edge "H" of said shaped steel members (29a) and (29b) determines the height level "h" of a washing water stored or filled in said washing chamber (B). Therefore, the level of said washing water is the horizontal line passing on said upper edge "H". Then, the upper edge "J" of said another partition wall (4) by which said wash-out/finishing chamber (C) is separated from said washing chamber (B) is so designed that it may be determined to be located a little lower than said horizontal line "L". This is because water in said wash-out/finishing chamber (C) can be overflown into said washing chamber (B).

On the contrary, in said wash-out/finishing chamber (C), said carry belts (10a), (10b), (10c) ... come out of the water level together with said articles. A pair of water discharge pipes (31a) and (31b) are so provided that said articles may pass between said water discharge pipes (31a) and (31b), each of which is provided with a plurality of nozzles (32) through which wash-out water is ejected against said articles thereunder.

In the attached drawings, water supply pipe for water discharge pipes (31a) and (31b) is indicated at (33). An upper cover for said discharge pipe (31a) is indicated at (34). An oscillator (35) is installed in the bottom section of said washing chamber (B). A drain pipe (36) is provided at the lowest part of said bring-in chamber (A) in order to drain water which is already used and is overflown into said chamber (A) from the upper edge "H" of said washing chamber (B).

A preferred apparatus disclosed by the present invention is so composed as to be shown in the above. In the practical use, a cock (not illustrated herein) of said water supply pipe (33) is firstly opened to cause washing water to be filled with said wash-out/finishing chamber (C) through both water discharge pipes (31a) and (31b) and then to be overflown into said washing chamber (B) in order to fill said chamber (B) with overflown water. As the level of this washing water reaches the horizontal line "L", said oscillator located in said chamber (B) is then started. Subsequently, said motor (17) is switched on to drive said carry roller means (5), (6), and (7), thereby causing said carry belts (8a), (8b), (8c), ... (9a), (9b), (9c), ... and (10a), (10b), (10c) ... to be rotated in order to carry articles (not illustrated) to be washed, in the direction from the inlet side (a) to the outlet side (b) of said washing/treatment tank (2). Namely, said articles to be washed which are placed on said carry belts in said bring-in chamber (A) travel in the direction of an arrow marking (e) of said carry belts (8a), (8b), (8c), ... and enter said washing chamber (B).

And said articles are held between a plurality of rollers (11a) and (5'a) mounted on said rotary shaft (5') and said presser roller shaft (11) at the terminating end of said bring-in chamber (A), thereby causing said articles to be brought in next washing chamber (B). At this time, said articles slide on said tongue (P) of said partition wall (3) and pass through the insertion port sealed by both upper and lower rubber-oriented elastic means (28a) and (28b), thereby causing said articles to be directly sent in the washing water stored in said washing chamber (B). Subsequently, said articles are placed and conveyed on said carry belts (9a), (9b), (9c), ... in said washing water and are irradiated by ultrasonic waves from said oscillator (35) during conveyance. Then, stains and dirts adhered to said articles are effectively eliminated through the above procedures.

Subsequently, said articles are conveyed to said wash-out/finishing chamber (C) beyond another partition wall (4). There, said articles are washed out and finished at their upper and lower surfaces with fresh water sprayed thereon from said nozzles of said water discharge pipes (31a) and (31b) while said articles are being conveyed by said carry belts (10a), (10b), (10c) ..

Now, said articles are taken out of said outlet side (b) of said washing/treatment tank (2) after washing treatment effected in the three chambers (A), (B) and (C).

In the above embodiment of the present invention, an ultrasonic wave transmitter is located at the bottom of said washing chamber (B). However, it can be easily understood by the skilled in this art that such a transmitter can be mounted at either of both of the side walls, or at the other adequate part, of said washing chamber (B) and that the number of the transmitters is not limited to one unit. Further, said belts used as carrying means can be replaced by another means such as a chain or belt or wire net as a matter of course.

We claim:

1. An ultrasonic waves washing apparatus comprising a washing/treatment tank divided into three sections such as a bring-in chamber, a washing chamber, and a wash-out/finishing chamber, said washing-out/finishing chamber being elevated in smooth slope with a certain fixed angle from said bring-in chamber to effect smooth washing treatment, thereby causing washing water contained in said wash-out/finishing chamber to be overflown into said washing chamber and said bring-in chamber in this order through partition walls, carry means such as belts, chains or wire nets mounted in each of said three chambers, an insertion port sealed by rubber-oriented elastic means, composed at a partition wall between said bring-in chamber and said washing chamber, said articles to be washed being directly inserted into a washing water contained in said washing chamber from said bring-in chamber through said insertion port, and an ultrasonic wave transmitter means mounted in said washing chamber.

2. An ultrasonic wave washing apparatus as defined in claim 1, wherein a pair of water ejecting discharge pipes are mounted in said washing chamber over and under said carry means with said carry means placed therebetween and each of said water ejecting discharge pipes are provided with a plurality of nozzles.

3. An ultrasonic wave washing apparatus defined in claim 1, wherein rubber-oriented elastic means are provided on and below said insertion port and the top edge thereof are folded along the advancement direction of said articles.

* * * * *